United States Patent
Yang et al.

(10) Patent No.: US 7,708,572 B2
(45) Date of Patent: May 4, 2010

(54) BURN-IN SOCKET HAVING PROTECTING DEVICE

(75) Inventors: Zheng-Qi Yang, ShenZhen (CN); Quan Wang, ShenZhen (CN); Jia-Jia Cai, ShenZhen (CN); Fu-Jin Peng, ShenZhen (CN)

(73) Assignee: Hon Hai Precision Ind. Co. Ltd., Taipei Hsien (TW)

( * ) Notice: Subject to any disclaimer, the term of this patent is extended or adjusted under 35 U.S.C. 154(b) by 0 days.

(21) Appl. No.: 12/386,631

(22) Filed: Apr. 21, 2009

(65) Prior Publication Data

US 2009/0263987 A1    Oct. 22, 2009

(30) Foreign Application Priority Data

Apr. 21, 2008   (CN)   .................... 2008 2 0034876 U

(51) Int. Cl.
*H01R 13/44*   (2006.01)
(52) U.S. Cl. ..................................... 439/140
(58) Field of Classification Search ................. 439/140, 439/141, 892
See application file for complete search history.

(56) References Cited

U.S. PATENT DOCUMENTS

| | | | | |
|---|---|---|---|---|
| 4,394,795 A | * | 7/1983 | Goss | ........................... 29/739 |
| 4,469,387 A | * | 9/1984 | McHugh | ...................... 439/140 |
| 4,897,765 A | * | 1/1990 | Berger | ......................... 361/732 |
| 4,992,054 A | * | 2/1991 | Cassan | ......................... 439/892 |
| 5,015,946 A | * | 5/1991 | Janko | ......................... 324/754 |
| 5,078,626 A | * | 1/1992 | Matsuoka et al. | ........... 439/892 |
| 5,090,927 A | * | 2/1992 | McAnany | .................... 439/892 |
| 5,348,488 A | * | 9/1994 | Green et al. | ................. 439/140 |
| 5,591,036 A | * | 1/1997 | Doi et al. | ....................... 439/79 |
| 5,879,171 A | * | 3/1999 | Wu | ............................... 439/79 |
| 5,971,774 A | * | 10/1999 | Kuki et al. | ..................... 439/79 |
| 6,171,133 B1 | * | 1/2001 | Altuner et al. | .............. 439/381 |
| 6,203,356 B1 | * | 3/2001 | Thomsen | .................... 439/381 |
| 6,749,445 B1 | * | 6/2004 | Chen | ........................... 439/79 |
| 6,866,552 B2 | * | 3/2005 | Koehler | ...................... 439/892 |
| 7,544,072 B2 | * | 6/2009 | Rubenstein et al. | ......... 439/135 |

FOREIGN PATENT DOCUMENTS

CN    2718814    8/2005

* cited by examiner

*Primary Examiner*—Neil Abrams
(74) *Attorney, Agent, or Firm*—Andrew C. Cheng; Wei Te Chung; Ming Chieh Chang

(57) ABSTRACT

A burn-in socket includes a base, a number of contacts received in the base, and a protecting device. The base has a first projection and a second projection. The protecting device is assembled to the base and moves from a first position to a second position relative to the base. The protecting device includes a planar bottom plate and a pair of spring arms extending upwardly from opposite sides of the bottom plate. Each spring arm has a first stopper for engaging with the first projection at the first position, and a second stopper for engaging with the second projection at the second position.

16 Claims, 6 Drawing Sheets

BURN-IN SOCKET HAVING PROTECTING DEVICE

BACKGROUND OF THE INVENTION

1. Field of the Invention

The present invention relates to a burn-in socket, and more particularly to a socket having a base and a protecting device moveable between a first position spaced apart from the base and a second position close to the base for protecting contacts from damaged, and the protecting device having stoppers for conveniently moving from the first position to the second position.

2. Description of the Prior Art

Electronic packages are installed in a printed circuit board to construct a complete circuit of continuous functions. To ensure the security and reliability of the electronic package during using, the electronic package must be tested before using. The test usually undergoes extended period of time at high temperature so that a defective package can be detected earlier. A so-called burn-in socket servers this purpose. The burn-in socket typically comprises a base, a plurality of contacts disposed on the base, latches and an actuator for driving the latches to open and close relative to the base. Because the contacts extend out of a bottom surface of the base after being assembled together that they will be easily damaged during transportation. In order to protect the electrical contacts of the electronic package from being damaged, a protecting device is necessary.

Chinese Pat No. 2718814 issued to Chen on Aug. 17, 2005 discloses a burn-in socket having a protecting device moveably from a first position spaced apart from the base to a second position close to the base. The protecting device provides with a plurality of holes to permit the tail of the contacts to extend therethrough individually. Opposite sides of the protecting device have two spring arms extended upwardly with lower hooks and upper hooks to engage with the base. When the socket is not installed on the printed circuit board, the protecting device is positioned at the first position and the upper hooks are engaging with the base to protect the contacts. When using the socket, the protecting device moves upwardly to the second position and the upper and lower hooks are both not engaging with the base. Thus, during assembling the socket to the printed circuit board, the protecting device is easily moving downwardly from the base, which will affect the instability of the burn-in socket.

SUMMARY OF THE INVENTION

Accordingly, an object of the present invention is to provide a burn-in socket with a protecting device moving from a first position to a second position and having stoppers for conveniently moving from the first position to the second position for protecting contacts from damaged.

In order to achieve the object set forth, a burn-in comprises a base, a plurality of contacts received in the base, and a protecting device assembled to the base. The base has a first projection and a second projection. The protecting device moves from a first position to a second position relative to the base. The protecting device comprises a planar bottom plate and a pair of spring arms extending upwardly from opposite sides of the bottom plate. Each spring arm has a first stopper for engaging with the first projection at the first position, and a second stopper for engaging with the second projection at the second position.

In order to further achieve the object set forth, a burn-in socket made according to the present invention comprises a base, a plurality of contacts received in the base and a protecting device. The base has a lower projection and an upper projection. A protecting device moveably mounted to a bottom end of the base comprises a planar bottom plate and a pair of spring arms extending upwardly from opposite sides of the bottom plate. Each spring arm has a first stopper and a second stopper engaging with the lower projection and upper projection respectively. When the first stopper engages with the lower projection, the second stopper is idle. When the second stopper engages with the upper projection, the first stopper is idle.

DESCRIPTION OF PREFERRED EMBODIMENT

Reference will now be made to the drawings to describe the present invention in detail.

Figure 1:
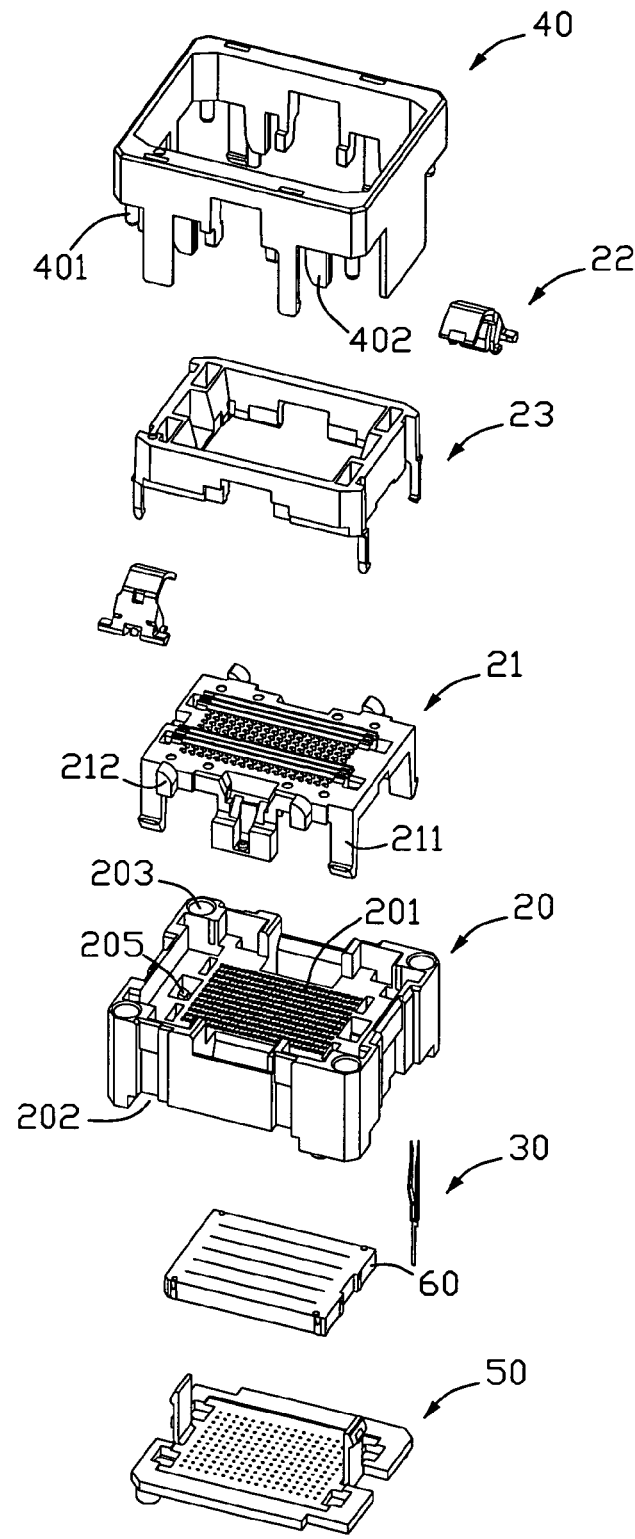
FIG. 1 is an exploded perspective view of a burn-in socket of the present invention.

FIG. 1 shows a burn-in socket used for testing an electronic package (not shown). The socket comprises a base 20, a plurality of contacts 30 disposed in the base 20, an actuator 40 assembled to the base 20 and moveable between an upper to lower direction, and a protecting device 50 moveable mounted to the base 20.

The base 2 is substantially rectangular and has an upper cavity 201 and lower cavity 202. The upper cavity 201 accommodates a sliding plate 21, a pair of clamping latches 22 and a securing frame 23. The lower cavity 202 assembles a fixed plate 60 and the protecting device 50. The sliding plate 21 includes a plurality of legs 211 extending downwardly and mounted to the base 20, and a pair of blocks 212 each provided with a curved surface for engaging with the actuator 40. The clamping latches 22 are arranged at opposite sides of the base 20. The actuator 40 has a plurality of legs (not labeled) moveably assembled to outsides of the base 20 and a plurality of driving arms 402 moveably matching with the blocks 212 of the sliding plate 21. The actuator 40 has four posts 401 at corners thereof and the base 20 has four corresponding holes 203 to receive the posts 401. There are four springs (not shown) disposed between each hole 203 and post 401. The sliding plate 21, the base 20, the fixed plate 60 and the protecting device 50 each have a plurality of passageways (not labeled) respectively for receiving the contacts 30.

Figure 2:
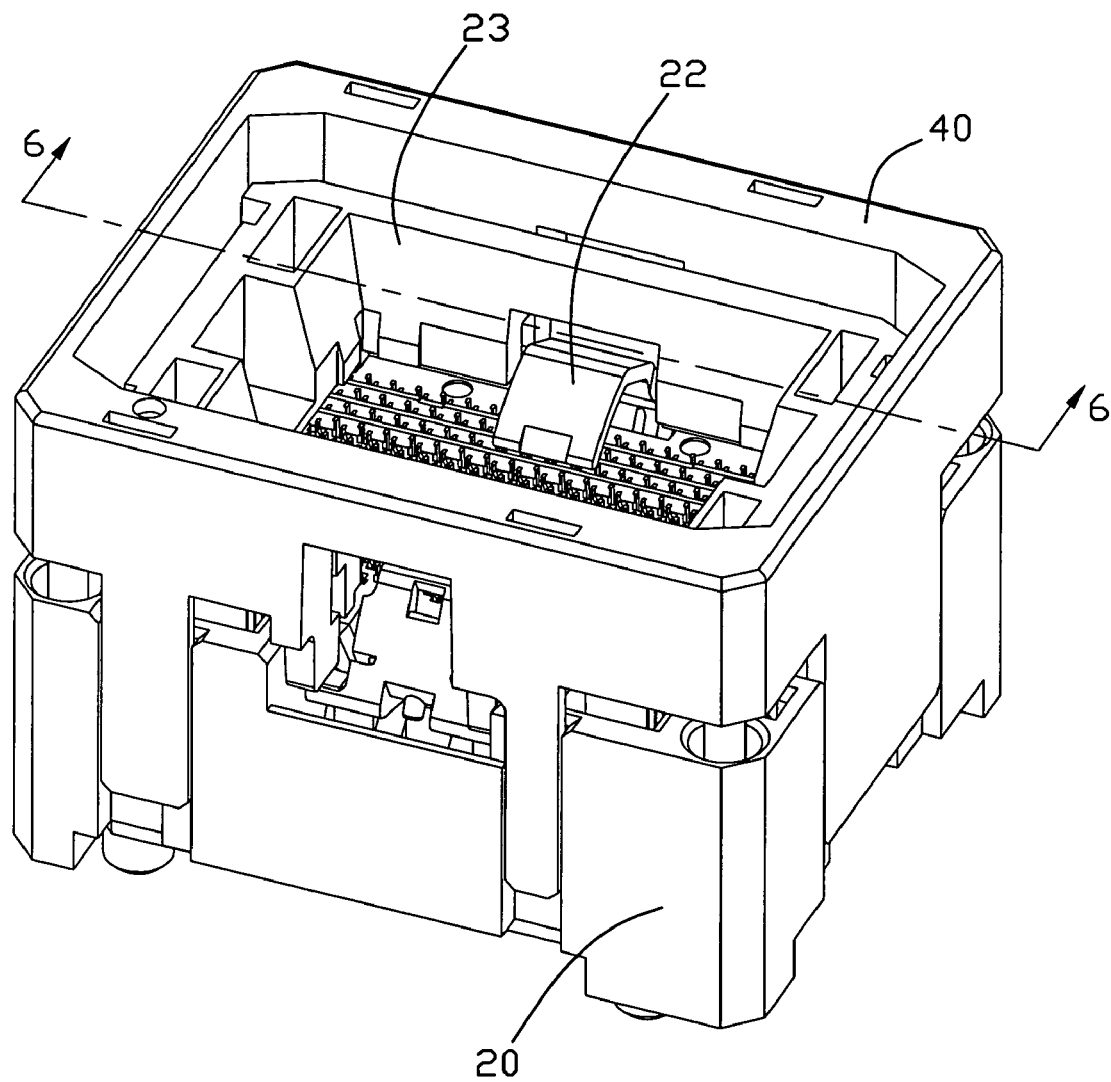
FIG. 2 is an assembled view of the burn-in socket shown in FIG. 1.

Referring to FIG. 2, the operation of the burn-in socket is described in detail. Firstly, press the actuator 40 downwardly toward the base 20 so that the clamping latches 22 are opened. In the meantime, the sliding plate 21 moves along the base 20 from one end to the other end together with the securing frame 23. Then, a pair of arms (not labeled) of each contact 30 are opened and the electronic package is engaging with the contacts 30. After release the actuator 40 to return to its original position driving by the springs, the sliding plate 21 and the securing frame 23 are returned to their original position driving by the contacts 30.

Figure 3:
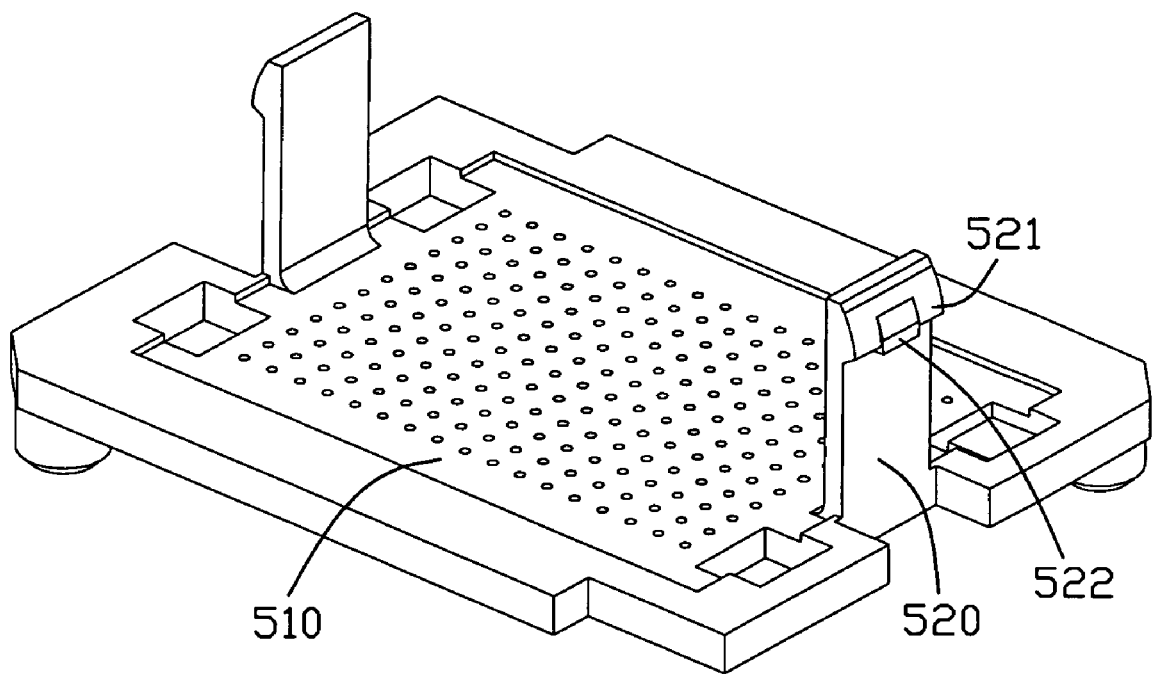
FIG. 3 is a perspective view of the protecting device of the burn-in socket shown in FIG. 1.
Figure 4:
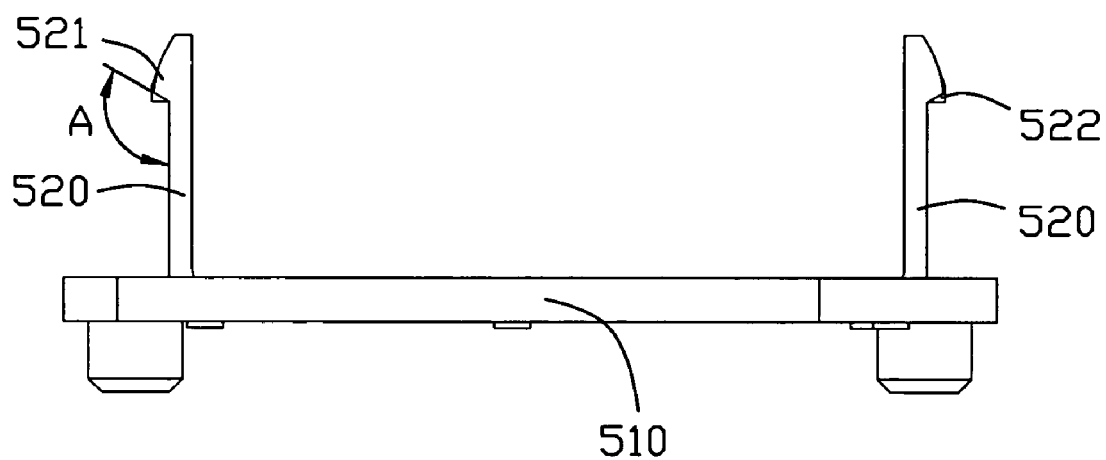
FIG. 4 is a side view of the protecting device shown in FIG. 3.

Referring to FIG. 3 and FIG. 4, the protecting device 50 includes a bottom plate 510 and a pair of spring arms 520 extending upwardly from opposite sides of the bottom plate 510. Each spring arm 520 has a second stopper 521 at free end thereof and has the same width of the spring arm 520. Bottom surface of the second stopper 521 and the spring arm 520 define an angle A which is more than 90 degree. A first stopper 522 is disposed on the second stopper 521 and spaced apart from the second stopper 521. Bottom surface of the first stopper 522 and the spring arm 520 define a right angle.

Figure 5:
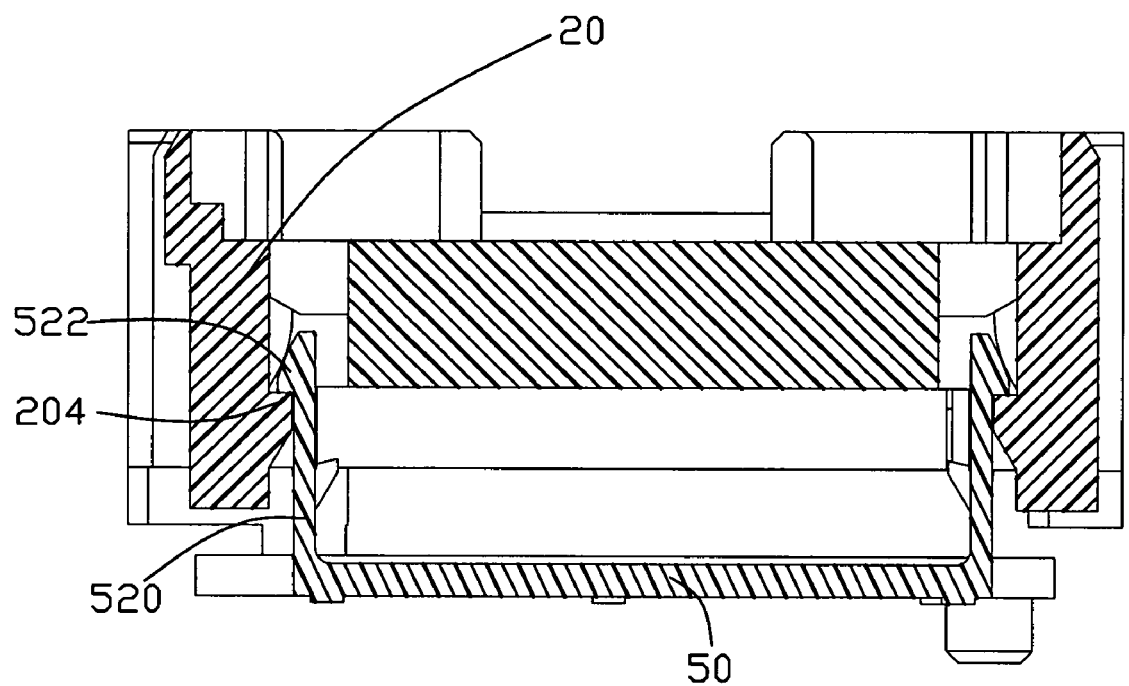
FIG. 5 is a side schematic view of the burn-in socket, showing the protecting device at a first position relative to the base.
Figure 6:
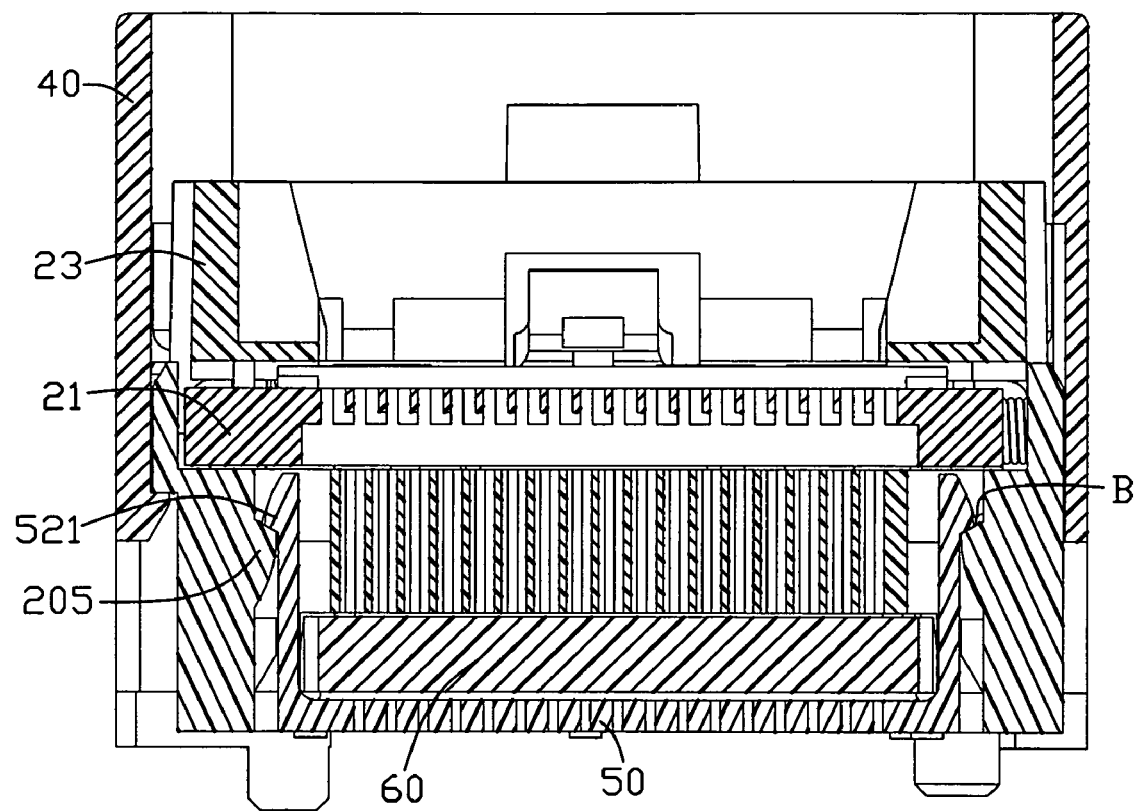
FIG. 6 is a side view of the burn-in socket taken along line 6-6 of FIG. 2, showing the protecting device at a second position relative to the base.

Referring to FIG. 5 and FIG. 6, the base 20 has projections 204, 205 to engage with the first and second stopper 522, 521. The projections 204, 205 are at different heights in a vertical direction. A lower projection adapted to engage with the first stopper 522 is called first projection 204 and an upper projection adapted to engage with the second stopper 521 is called second projection 205. The first projection 204 has an upper surface perpendicular to the base 20. Upper surface of the second projection 205 and vertical surface of the base 20 define an angle B. The angle B equals to the angle A.

FIG. 5 and FIG. 6 also show the protecting device 50 moving from a first position spaced apart from the base 20 to a second position close to the base 20. Referring to FIG. 5, the protecting device 50 is at the first position with the first stopper 522 engaging with the first projection 204 and the second stopper 521 being idle. Referring to FIG. 6, the protecting device 50 is at the second position and mounted on the printed circuit board. At this state, the second stopper 521 engages with the second projection 205 and the first stopper 522 is idle.

The protecting device 50 is used to protect the contacts 30. When the protecting device 50 is located at the first position, the contact 30 is substantially flushed to the bottom surface of the protecting device 50 for best protecting the contact 30. When the protecting device 50 is located at the second position, the contacts 30 are extending out of the bottom surface of the protecting device 50 for electrically contacting with the printed circuit board. Because the second projection 205 has an obtuse angle B so that an oblique upper surface thereof can provide an upward force for the second stopper 521 when the protecting device 50 moves from the first position to the second position. Due to the second stopper 521 and the second projection 205 have corresponding obtuse angles A, B, the protecting device 50 can easily move and stably engage with the second stopper 521.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A burn-in socket comprising:
   a base having a first projection and a second projection;
   a plurality of contacts received in the base;
   a protecting device assembled to the base and moving from a first position to a second position relative to the base, the protecting device comprising a planar bottom plate and a pair of spring arms extending upwardly from opposite sides of the bottom plate, each spring arm having a first stopper for engaging with the first projection at the first position and a second stopper for engaging with the second projection at the second position.

2. The burn-in socket as claimed in claim 1, wherein bottom surface of the second stopper and the spring arm define an angle more than 90 degree, and upper surface of the second projection and vertical surface of the base define a corresponding angle.

3. The burn-in socket as claimed in claim 1, wherein bottom surface of the first stopper is perpendicular to the spring arm and upper surface of the first projection is perpendicular to vertical surface of the base.

4. The burn-in socket as claimed in claim 1, wherein the base includes an upper cavity and a lower cavity.

5. The burn-in socket as claimed in claim 4, wherein the upper cavity has a moveable sliding plate relative to the base, a fixed frame assembled upon the sliding plate and a pair of clamping latches disposed at opposite sides of the cavity.

6. The burn-in socket as claimed in claim 4, wherein the protecting device is disposed in the lower cavity and a fixed plate is positioned therebetween for securing the contacts.

7. The burn-in socket as claimed in claim 1, wherein the second projection is higher than the first projection.

8. The burn-in socket as claimed in claim 1, wherein the second stopper has the same width with the spring arm.

9. The burn-in socket as claimed in claim 8, wherein the first stopper is disposed on the second stopper and spaced apart from the second stopper.

10. A burn-in socket comprising:
    a base having a lower projection and an upper projection;
    a plurality of contacts received in the base;
    a protecting device moveably mounted to a bottom end of the base and comprising a planar bottom plate and a pair of spring arms extending upwardly from opposite sides of the bottom plate, each spring arm having a first stopper and a second stopper engaging with the lower projection and upper projection respectively, when the first stopper engaging with the lower projection, the second stopper being idle, when the second stopper engaging with the upper projection, the first stopper being idle.

11. The burn-in socket as claimed in claim 10, wherein upper surface of the lower projection and vertical surface of the base define an right angle, and upper surface of the upper projection and the vertical surface of the base define an angle more than 90 degree.

12. The burn-in socket as claimed in claim 11, wherein bottom surface of the first stopper and the spring arm define a right angle, and bottom surface of second stopper and the spring arm define an equal angle with the upper surface of the upper projection and the vertical surface of the base.

13. The burn-in socket as claimed in claim 10, wherein the second stopper has the same width with the spring arm.

14. The burn-in socket as claimed in claim 10, wherein the first stopper is disposed at the middle of the second stopper and separate the second stopper.

15. The burn-in socket as claimed in claim 10, wherein the base includes an upper cavity and lower cavity.

16. The burn-in socket as claimed in claim 15, wherein the upper cavity has a moveable sliding plate respective to the base, a fixed frame positioned upon the sliding plate and a pair of clamping latches disposed at opposite sides of the cavity.

* * * * *